United States Patent
En et al.

(10) Patent No.: US 6,723,666 B1
(45) Date of Patent: Apr. 20, 2004

(54) METHOD FOR REDUCING GATE OXIDE SURFACE IRREGULARITIES

(75) Inventors: William G. En, Milpitas, CA (US); Philip A. Fisher, Foster City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/379,792

(22) Filed: Mar. 6, 2003

(51) Int. Cl.[7] .................. H01L 21/31; H01L 21/469; H01L 21/302

(52) U.S. Cl. .................. 438/798; 438/308; 438/723; 438/795

(58) Field of Search .................. 438/798, 197, 438/294, 308, 723, 795

(56) References Cited

U.S. PATENT DOCUMENTS

| | | | | |
|---|---|---|---|---|
| 5,556,806 A | * | 9/1996 | Pan et al. ............... | 438/624 |
| 6,159,861 A | * | 12/2000 | Asai et al. ............... | 438/706 |
| 6,287,988 B1 | * | 9/2001 | Nagamine et al. ....... | 438/770 |
| 6,372,671 B1 | * | 4/2002 | Fortin .................... | 438/787 |
| 6,402,974 B1 | * | 6/2002 | Trevor et al. ............ | 216/67 |
| 6,432,835 B1 | * | 8/2002 | Yunogami et al. ....... | 438/720 |
| 6,555,485 B1 | * | 4/2003 | Liu et al. ................ | 438/776 |
| 6,649,538 B1 | * | 11/2003 | Cheng et al. ............ | 438/775 |
| 2003/0100155 A1 | * | 5/2003 | Lim et al. ................ | 438/197 |

* cited by examiner

*Primary Examiner*—Alexander Ghyka

(57) ABSTRACT

Gate oxide surface irregularities, such as surface roughness, are reduced by treatment with an oxygen-containing plasma. Embodiments include forming a gate oxide layer and then treating the formed gate oxide layer with an oxygen plasma to repair weak spots and fill in pin holes and surface irregularities, thereby reducing gate/gate oxide interface roughness.

10 Claims, 2 Drawing Sheets

METHOD FOR REDUCING GATE OXIDE SURFACE IRREGULARITIES

FIELD OF THE INVENTION

The present invention relates to a method of manufacturing semiconductor devices comprising MOS-type transistors and integrated circuits exhibiting improved quality, e.g., improved channel carrier mobility, high transistor drive current and improved circuit performance. The present invention is particularly applicable in fabricating high density integration semiconductor devices with a design rule less than 0.12 micron.

BACKGROUND OF THE INVENTION

The escalating requirements for high density and performance associated with ultralarge-scale integration (ULSI) semiconductor devices require a design rule of about 0.12 micron and below, increased transistor and circuit speeds, high reliability and quality, and increased manufacturing throughput for economic competitiveness. The reduction of design rules to 0.12 micron and below challenges the limitations of conventional semiconductor manufacturing techniques.

High performance microprocessor applications require rapid speed of semiconductor circuitry. A limitation on the drive current of a transistor stems from reduced carrier mobility, i.e., electron or hole mobility, in the channel region of a MOSFET. The reduction of channel carrier mobility reduces the drive current and performance of the circuit.

Accordingly, there exists a need for efficient, cost-effective methodology enabling the fabrication of MOS devices exhibiting improved transistor drive current and circuit performance and high gate dielectric reliability. There exists a particular need for such methodology for fabricating semiconductor devices having a design rule of about 0.12 micron and under which is compatible with conventional process flow for improved efficiency and increased manufacturing throughput.

DISCLOSURE OF THE INVENTION

An advantage of the present invention is an improved method of fabricating semiconductor devices which exhibit increased channel carrier mobility, improved transistor drive current, improved circuit performance and improved gate dielectric reliability.

Additional advantages and other features of the present invention will be set forth in the description that follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are achieved in part by a method of manufacturing a semiconductor device, the method comprising: forming a gate oxide layer on an upper surface of a semiconductor substrate, the gate oxide layer having an upper surface with surface imperfections; and treating the upper surface of the gate oxide layer with an oxygen-containing plasma to reduce the surface imperfections.

Embodiments of the present invention comprise thermally oxidizing the upper surface of a silicon-containing semiconductor substrate to form the gate oxide layer having surface imperfections, such as an average surface roughness (Ar) of 2 Å or greater, and then treating the upper surface with the oxygen-containing plasma to reduce the surface imperfections resulting in a plasma treated gate oxide layer having an upper surface with an average surface roughness less than 1 Å. Subsequent processing is conducted in a conventional manner to form a gate electrode and source/drain regions, thereby completing the MOSFET.

Additional advantages and aspects of the present invention will become readily apparent to those skilled in the art from the following detailed description, wherein only the preferred embodiment of the present invention is shown and described, simply by way of illustration of the best mode contemplated for carrying out the present invention. As will be described, the present invention is capable of other and different embodiments, and its several details are susceptible of modification in various obvious respects, all without departing from the spirit of the present invention. Accordingly, the drawing and description art to be regarded as illustrative in nature, and not as restrictive.

DESCRIPTION OF THE INVENTION

Figure 1:
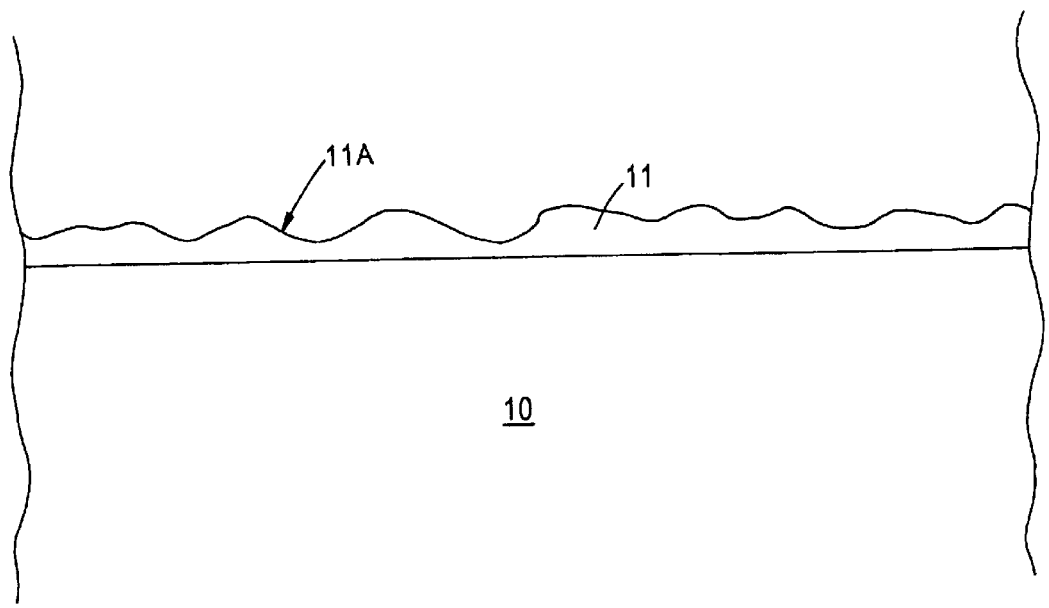
FIGS. 1 through 4 schematically illustrate sequential steps in accordance with an embodiment of the present invention, wherein like reference characters denote like features.
Figure 2:
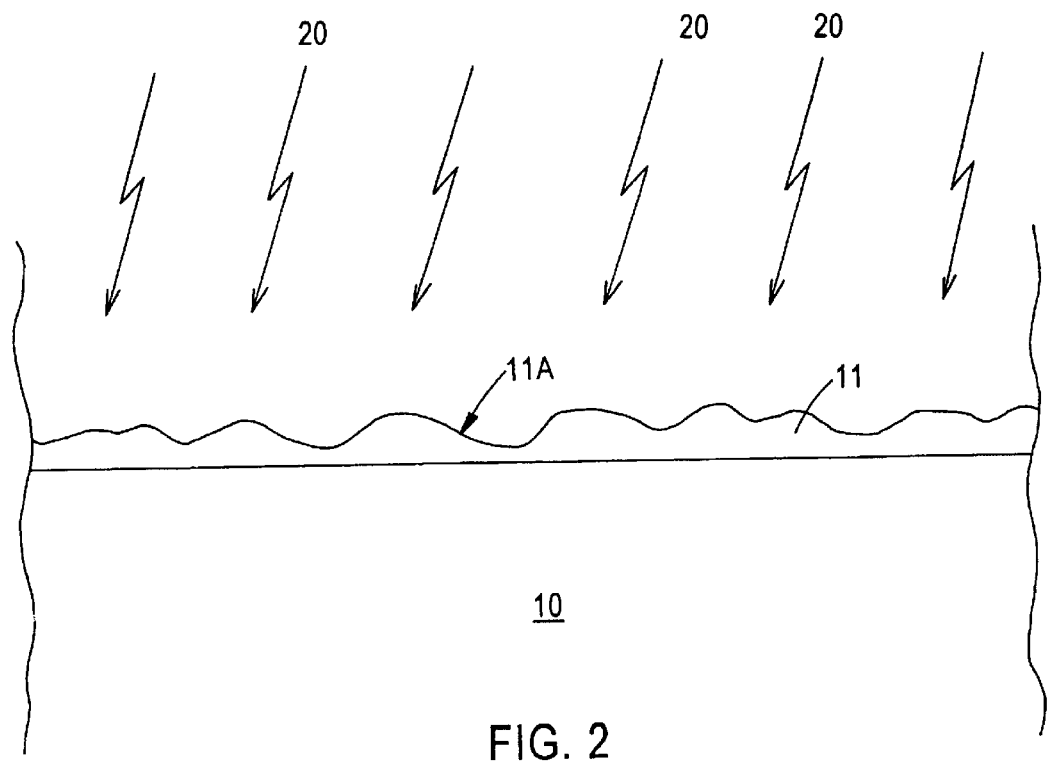

The present invention addresses and solves the reduced channel carrier mobility problem in MOSFETs which limits the drive current of the transistor and, hence, circuit performance. The reduction in channel carrier mobility can occur by scattering as the result of impurities, vibrations or surface irregularities. It is believed that the predominant factor responsible for carrier scattering through the silicon lattice is due to surface imperfections, such as surface roughness, pin holes and weak spots between the gate electrode layer and underlying gate dielectric layer, e.g., the silicon/silicon oxide interface. This problem is believed to be exacerbated as the thickness of gate oxide layer is reduced to below about 50 Å, e.g., below about 20 Å, in order to satisfy reduced design rule requirements necessitated by the drive for miniaturization. The problem of carrier scattering at the gate/gate oxide interface is believed to be exacerbated as the gate oxide layer is reduced in thickness due to thin, atomic scale roughness introduced by oxidation of the silicon surface prior to gate formation, since a silicon atom diameter is about 5.4 Å.

It was found that when a silicon oxide layer is formed, atomic scale variations appear on the surface of the gate oxide layer. These atomic scale variations in surface roughness increase carrier scattering and, hence, reduce channel carrier mobility. By the present invention, the surface roughness of relatively thin gate oxide layers, e.g., less than about 50 Å, such as less than about 20 Å, is improved by strategically treating a gate oxide layer, after formation and containing surface imperfections, with an oxygen-containing plasma. It was found that by treatment with an oxygen-containing plasma, e.g., a plasma wherein oxygen is the only reactive species, surface imperfections can be dramatically reduced. For example, it was found that treatment with an oxygen-containing plasma effectively strengthens weak spots, fills in pin holes and also fills in the irregular surface, thereby significantly reducing surface roughness. A thermally formed silicon oxide layer on a silicon-containing substrate typically exhibits an average surface roughness (Ra) of 2 Å or greater and various imperfections, such as pin holes and weak spots. Exposure of such an irregular surface to an oxygen-containing plasma can effectively reduce the average surface roughness (Ra) to less than 1 Å, strengthen the weak spots and eliminate pin holes, thereby not only enabling fabrication of transistors with a smooth gate/gate oxide interface but also increasing gate oxide reliability.

An embodiment of the present invention is schematically illustrated in FIGS. 1 through 4. Adverting to FIG. 1, a silicon oxide film 11 is formed on a silicon-containing substrate 10 in a conventional manner, as by heating in an oxygen ambient at a temperature of about 900° C. to about 1150° C. Thermal oxide film 11 typically has a surface 11A which fraught with imperfections such as pin holes, weak spots and roughness. In accordance with the present invention, the upper surface 11A of thermally formed silicon oxide layer 11 is exposed to an oxygen-containing plasma, as illustrated by arrows 20 in FIG. 2. The optimum plasma conditions can be determined for a particular situation depending upon, inter alia, the thickness of the silicon oxide film 11, the degree of irregularities and tool specific applications in either low pressure or high pressure configurations. For example, for a silicon oxide film 11 having a thickness of about 50 Å or less, plasma treatment can be conducted at an oxygen flow rate of 5 to 10,000 sccm, pressure of 50 mTorr to 3,000 mTorr, temperature of 25° C. to 900° C., and RF power of 50 to 300 watts. The duration of plasma treatment can be determined for a particular situation and would typically run 1 to 60 seconds. It is advantageous to treat the silicon oxide film 11 with only oxygen as the reactive species to insure that the dielectric constant of the treated film does not change by virtue of forming compounds, such as silicon nitride, which would elevate the dielectric constant in different areas on the surface thereby generating nonuniformities in the dielectric constant with an attendant fluctuation in channel function and carrier injection.

Figure 3:
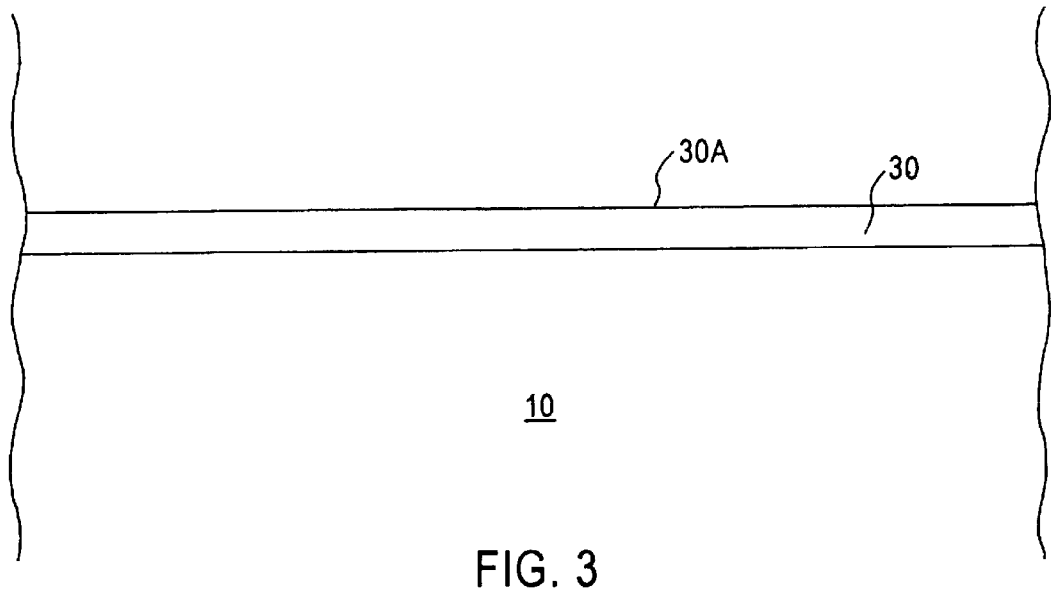

Adverting to FIG. 3, the resulting oxygen-plasma treated gate oxide layer 30 exhibits a relatively smooth upper surface 30A, with a surface roughness less than 1 Å. As a result of oxygen-plasma treatment, pin holes are eliminated, weak spots reinforced and surface irregularities filled in. By confining the plasma to a oxygen reactive species, there is substantially no variation in the dielectric constant across the upper surface of the gate oxide layer 30, thereby reducing any possibility of channel function and carrier injection characteristics.

Figure 4:
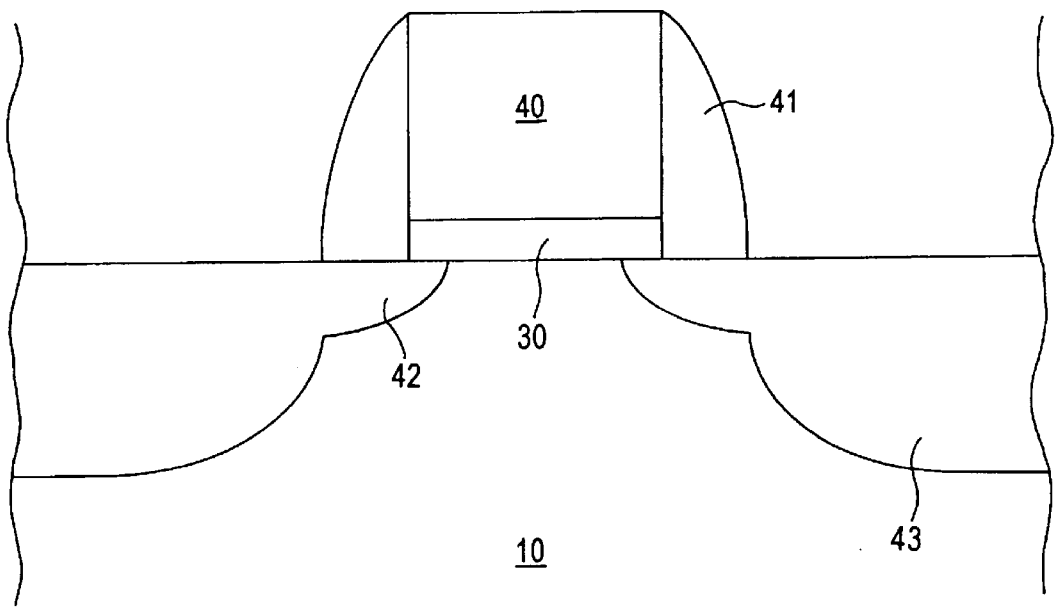

Subsequent processing is conducted in a conventional manner, as by depositing a gate electrode layer, such as doped polycrystalline silicon, and patterning to form a gate electrode 40, as illustrated in FIG. 4, overlying gate oxide layer 30. Typically, source/drain extensions 42 are formed, followed by forming sidewall spacers 41 and deep source/drain regions 43, thereby completing formation of the MOSFET.

The present provides simplified methodology enabling the fabrication of highly miniaturized semiconductor devices having gate oxide layers with improved reliability and reduced surface roughness at the interface between the gate electrode and gate oxide layer.

The present invention enjoys industrial utility in fabricating any of various types of semiconductor devices. The present invention enjoys particular industrial utility in enabling fabricating semiconductor devices having submicron features, e.g., a design rule less than about 0.12 micron, with improved channel carrier mobility by reducing surface imperfections, such as surface roughness between the gate electrode and underlying gate dielectric layer. The reduction in surface scattering improves channel carrier mobility and, hence, increases the drive current of the transistor and improves circuit performance.

In the previous description, numerous specific details are set forth, such as specific materials, structures and processes, in order to provide a better understanding of the present invention. However, the present invention can be practiced without resorting to the details specically set forth. In other instances, well known processing materials and techniques have not been described in order not to unnecessarily obscure the present invention.

Only the preferred embodiment of the present invention and but a few examples of its versatility are shown and described in the present disclosure. It is to be understood that the present invention is capable of use in various combinations and environments and is susceptible of changes and/or modifications within the scope of the inventive concept as expressed herein.

What is claimed is:

1. A method of manufacturing a semiconductor device, the method comprising:

forming a gate oxide layer on an upper surface of a semiconductor substrate, the gate oxide layer having an upper surface with surface imperfections; and treating the upper surface of the gate oxide layer with an oxygen-containing plasma to reduce the surface imperfections.

2. The method according to claim 1, comprising thermally oxidizing the upper surface of a silicon-containing semiconductor substrate to form the gate oxide layer.

3. The method according to claim 1, wherein the plasma consist essentially of oxygen as the reactive species.

4. The method according to claim 1, comprising treating the upper surface of the gate oxide layer to reduce surface roughness such that the plasma treated surface has an average surface roughness (Ra) less than 1 Å.

5. The method according to claim 4, comprising forming the gate oxide layer with an average surface roughness (Ra) of 2 Å or more.

6. The method according to claim 1, comprising treating the upper surface of the gate oxide layer such that the dielectric constant (k) of the gate oxide layer is substantially constant along its upper surface.

7. The method according to claim 1, comprising treating the upper surface of the gate oxide layer with the oxygen-containing plasma at:

an oxygen flow rate of 5 to 10,000 sccm;

a pressure of 50 to 3,000 mTorr;

a temperature of 25° C. to 900° C.; and an RF power of 50 to 300 watts.

8. The method according to claim 7, comprising treating the upper surface of the gate oxide layer with the oxygen-containing plasma for 1 to 60 seconds.

9. The method according to claim 1, further comprising:

forming a gate electrode layer on the upper surface of the plasma treated gated oxide layer;

patterning to form a gate electrode over the upper surface of the semiconductor substrate with the gate oxide layer therebetween; and forming source/drain regions in the semiconductor substrate.

10. The method according to claim 1, comprising treating the upper surface of the gate oxide layer with the oxygen-containing plasma to reduce surface imperfections and thereby forming a gate oxide layer a thickness of less than 20 Å.

* * * * *